United States Statutory Invention Registration [19]

[11] Reg. Number: H422

Daniels et al. [43] Published: Feb. 2, 1988

[54] APPARATUS FOR INVERTING ARTICLES AND METHOD FOR USING SAME

[75] Inventors: Leroy A. Daniels, Chatham Township, Morris County; George R. Westerman, Denville, both of N.J.

[73] Assignee: American Telephone and Telegraph Company, AT&T Bell Laboratories, Murray Hill, N.J.

[21] Appl. No.: 855,718

[22] Filed: Apr. 25, 1986

[51] Int. Cl.[4] ..... B25J 15/06

[52] U.S. Cl. ..... 414/763; 198/403; 198/409; 414/737; 269/21

[58] Field of Search ..... 414/737, 754, 758, 759, 414/763, 771, 774, 783, 786; 269/21, 903; 198/403, 409

[56] References Cited

U.S. PATENT DOCUMENTS

| | | | |
|---|---|---|---|
| 2,829,759 | 4/1958 | Parker | 198/403 |
| 3,552,582 | 4/1969 | Hanft | 414/739 |
| 3,955,686 | 5/1976 | Kumagai | 414/759 |
| 4,095,700 | 6/1978 | Chiuaru et al. | 414/759 |
| 4,119,211 | 10/1978 | Boyer et al. | 198/432 X |
| 4,226,569 | 10/1980 | Gerard et al. | 414/783 X |
| 4,433,835 | 2/1984 | Wheeler | 269/21 X |
| 4,457,662 | 7/1984 | Ireland et al. | 414/763 X |
| 4,498,840 | 2/1985 | Orri | 414/759 |
| 4,533,291 | 8/1985 | Nishida | 414/728 |
| 4,539,479 | 9/1985 | Sheets et al. | 198/403 X |

FOREIGN PATENT DOCUMENTS

| | | | |
|---|---|---|---|
| 2447777 | 4/1975 | Fed. Rep. of Germany | 198/403 |
| 421073 | 8/1974 | U.S.S.R. | |

*Primary Examiner*—Harold J. Tudor
*Attorney, Agent, or Firm*—Wendy W. Koba

[57] ABSTRACT

The present invention relates to a method and apparatus for inverting articles utilizing a fixture which comprises a pair of hinged plates each containing a plurality of holes. The holes in opposite sides are in alignment with one another and are connected to two vacuum switches so that vacuum to each plate can be independently controlled. Articles recognized as being upside down are placed over the holes in a first plate with the vacuum activated on that side to secure the articles to the plate. The plates are then rotated together about the hinge. The vacuum on the first plate is released, and the vacuum on the second plate is activated. As a consequence, the articles are transferred right side up to the second plate.

15 Claims, 5 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

APPARATUS FOR INVERTING ARTICLES AND METHOD FOR USING SAME

BACKGROUND OF THE INVENTION

1. Field of the Invention

The present invention relates to a method and apparatus for inverting articles and, more particularly, to such apparatus which comprises a pair of hinged plates with vacuum control means for transferring a set of inverted articles from one plate to another as the plates are brought together.

2. Description of the Prior Art

Many systems utilize components which have a preferred orientation for their intended use. During the manufacture of such components, it is often necessary to correctly orient them before testing their integrity. Prior art inversion systems utilized suction cups and pivotal members to reverse articles. Descriptions of such systems may be found in U.S. Pat. No. 3,522,582 issued to K. E. Hanft on Jan. 5, 1971, and U.S. Pat. No. 4,498,840 issued to M. Orii on Feb. 12, 1985.

In some systems, most notably integrated circuit and lightwave systems, many components are extremely small and are not well-suited for use with the systems disclosed by Hanft and Orii. In lightwave systems, for example, the transmitting and detecting components may become inverted during handling and must be righted before testing. Turning of individual components by hand may be accomplished by an operator on the assembly line. These components, however, are very small in size (on the order of 10 mils × 10 mils) and it is extremely time-consuming for inverted chips to be turned by hand using a tool such as a micromanipulator. An alternative system previously proposed pushes the components off of a ledge where approximately 60% of the components will land right side up after falling a predetermined distance. Additional attempts at reorientation are then used to flip over those chips that did not invert the first time. Thus, to achieve 100% inversion, this push-off technique must be repeated a number of times, where the number of tries required will vary from time to time. Obviously, this is not a preferred technique for inverting fragile components.

Thus, a need remains for an arrangement for inverting articles, especially fragile components, which is relatively fast and capable of inverting all of the articles without requiring human intervention.

SUMMARY OF THE INVENTION

The present invention relates to method and apparatus for inverting articles and, more particularly, to such apparatus which comprises a pair of hinged plates including a plurality of holes with vacuum control means for transferring a set of inverted articles positioned over the holes from one plate to another as the plates are brought together.

It is an aspect of the present invention to provide an apparatus which is capable of inverting extremely fragile articles, for example, lightwave emitters and detectors.

Another aspect of the present invention to provide an inverting apparatus and system which utilize switchable vacuum control to secure a set of inverted articles to a first plate of the pair of hinged plates, the plate having a plurality of vacuum of vacuum openings in its top surface so that the articles remain motionless as the plates are brought into proximity. This vacuum is released when the plates meet and a second vacuum connected to the remaining plate (which also includes a plurality of vacuum holes formed in its top surface) is then activated to secure the articles in their righted position to the top surface of the remaining plate.

In one method of practicing the present invention, the plate for holding the correctly positioned articles remains motionless and the remaining plate, holding the inverted articles, is rotated 180° about the pivot point of the hinge to transfer the articles. Alternatively, the inverted chips may be placed on the stationary plate.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
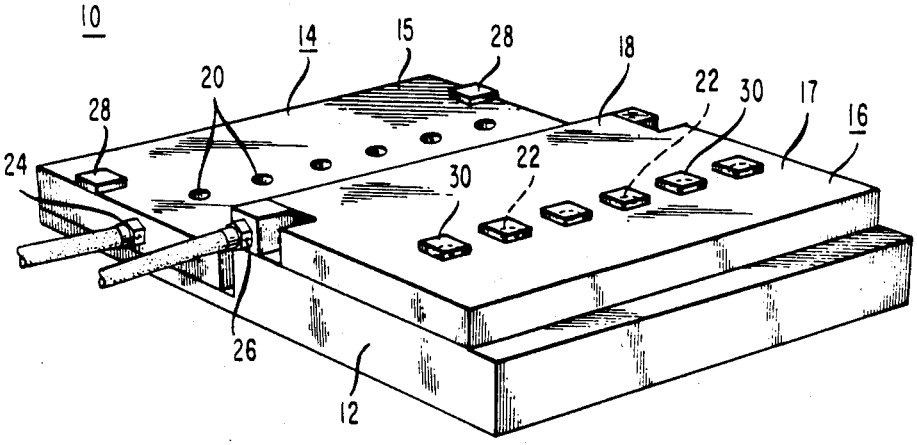
FIG. 1 illustrates an exemplary inverting apparatus formed in accordance with the present invention, shown in a fully open position for the placement of the inverted articles on a selected plate of the pair of hinged plates.

FIG. 1 illustrates an exemplary inverting apparatus 10 formed in accordance with the present invention. For the sake of discussion, the operation of inverting apparatus 10 will be described in terms of inverting a set of lightwave components, also referred to as chips, which may include either light emitters (semiconductor lasers of LEDs) or light detectors (p.i.n. or avalanche photodiodes). However, it is to be understood that the apparatus of the present invention may be utilized to invert any article which requires a 180° rotation, for whatever purpose, where only the size of the individual pieces forming inverting apparatus 10 will be modified as required.

Referring to FIG. 1, inverting apparatus 10 is seen to comprise a stationary base member 12 which may be formed of metal, plastic, or any other suitable material. A first plate 14 is formed on top of base member 12, where in this particular embodiment, first plate 14 is positioned on the left-hand side of base member 12. A second plate 16 is positioned opposite to first plate 14 on the right-hand side of base member 12. For the exemplary inversion apparatus 10, first plate 14 remains stationary during the inversion process and second plate 16 fully rotates towards plate 14. It is to be understood that the roles of these plates may be reversed, that is, first plate 14 may rotate while second plate 16 remains fixed. Alternatively, both plates 14 and 16 may be configured to pivot towards each other, for example, each plate moving approximately 90°. Any of these configurations, as well as many others, may be used to perform the article inversion in accordance with the teachings of the present invention. Returning to the particular embodiment of FIG. 1, first plate 14 can thus be considered as a fixed, or stationary plate and second plate 16 as a hinged plate, where plate 16 is connected to a pivot member 18. Pivot member 18 is activated when a plate contains a full array of inverted chips so as to move hinged plate 16 in the direction of the arrow shown in FIG. 1 towards plate 14. Any mechanism of choice may be used to activate pivot member 18.

Stationary plate 14 and hinged plate 16 include a plurality of holes 20 and 22, formed in top surfaces 15 and 17, respectively. Holes 20 in stationary plate 14 are connected to a vacuum source (not shown) via a vacuum inlet 24. Similarly, holes 22 in hinged plate 16 are connected to a vacuum source (not shown) via a vacuum inlet 26. Both pluralities of holes 20 and 22 are illustrated as forming a single line from the front to the back of plates 14 and 16. However, these vacuum holes may be disposed in any pattern which is suited for the particular articles to be inverted. Additionally, it is preferred to form holes 20 and 22 with a diameter which is less than that of the articles. This restriction insures that the articles adhere securely upon transfer. For example, when laser diode chips are to be inverted, where these chips normally comprise a 10 mil$\times$10 mil size, vacuum holes on the order of, for example, 6 mil are adequate. Further, in order to achieve accurate transfer of the articles, holes 20 and 22 should be equal in number and substantially aligned.

In performing the inversion process of the present invention, the inverted articles may be initially placed on either plate, where transfer between plates 14 and 16 occurs when plates 14 and 16 are brought into close proximity and the associated vacuum connections switched. That is, the inverted articles may be initially placed to cover holes 22 in plate 16 and secured thereon by activating the vacuum attached to inlet 26. The articles are then transferred to plate 14 after hinged plate 16 has fully rotated towards fixed plate 14. This transfer is accomplished by deactivating the vacuum associated with plate 16 and activating the vacuum associated with plate 14. In practicing the present invention, it is advisable to keep plates 14 and 16 from fully contacting, since such contact could damage the transferred articles. A pair of spacer elements 28 included on stationary plate 14, as seen in FIG. 1, may be utilized for this purpose. Spacer 28, although shown as two separate elements, may comprise any arrangement, formed on either or both plates, suitable for maintaining a separation between plates 14 and 16. For example, a single rib running the length of plate 14 may be utilized.

Figure 2:
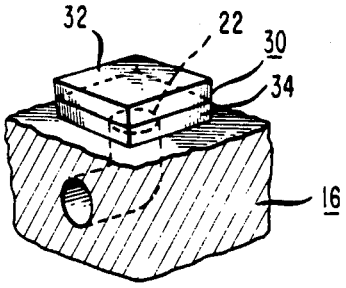
FIG. 2 illustrates a typical lightwave component, or chip, which may be inverted using the apparatus of the present invention.

An exemplary laser diode 30 which may be inverted using inverting apparatus 10 is illustrated in FIG. 2. Laser diode 30 may comprise an InGaAsP laser diode including an n-type conductivity layer 32 and a p-type conductivity layer 34. During inspection and testing, it is required that laser diode 30 be oriented so that n-side 32 is underneath p-side 34. Thus, various laser diodes 30 which arrive at the test site in an inverted form (with n-side 32 up) may be inverted using apparatus 10. A small number of such laser diodes 30 are illustrated in phantom in FIG. 1 as being positioned over vacuum holes 22 in hinged plate 16.

Figure 3:
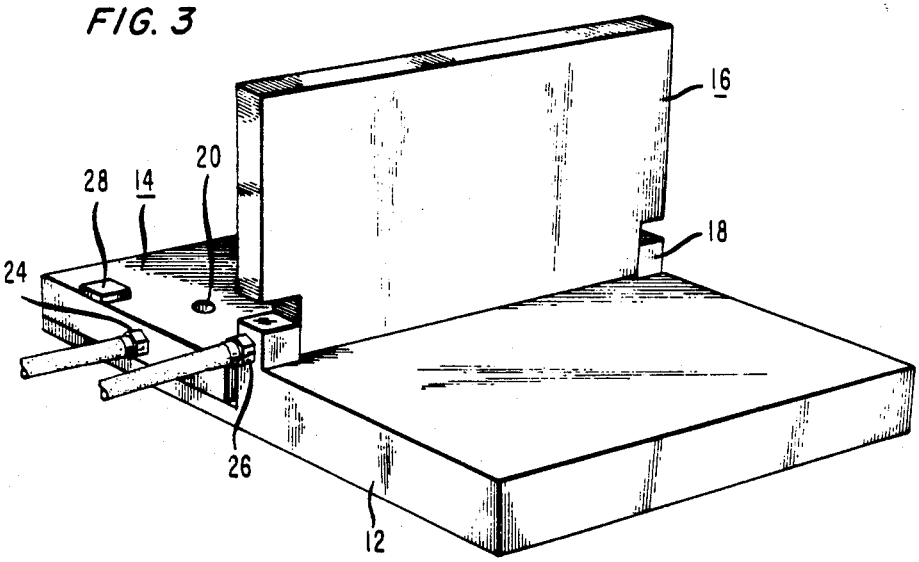
FIG. 3 illustrates the apparatus of FIG. 1 where the hinged plate is partially rotated towards the fixed plate.

FIG. 3 illustrates inverting apparatus 10 as hinged plate 16 is in motion towards stationary plate 14. In the case where the inverted chips 30 are initially loaded on hinged plate 16, the vacuum applied through inlet 26 is of a sufficient strength so as to hold chips about pivot element 18.

Figure 4:
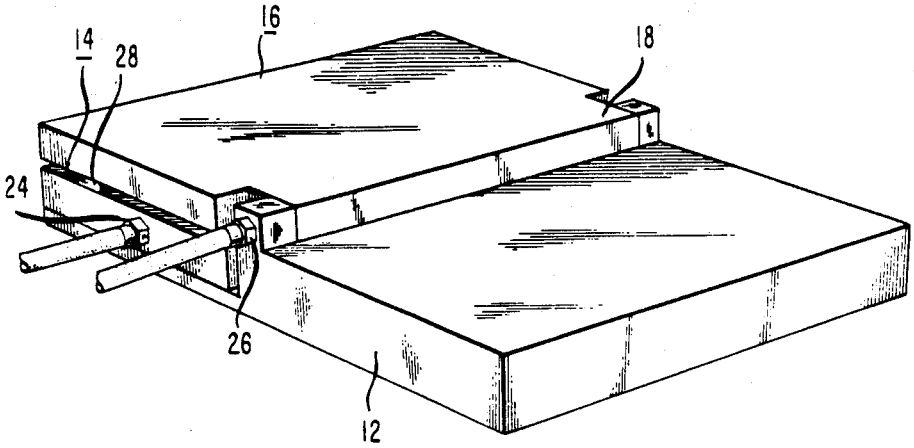
FIG. 4 illustrates the apparatus of FIG. 1 where the hinged plate is fully rotated to be positioned over the fixed plate to allow the transfer of the articles between plates.
Figure 5:
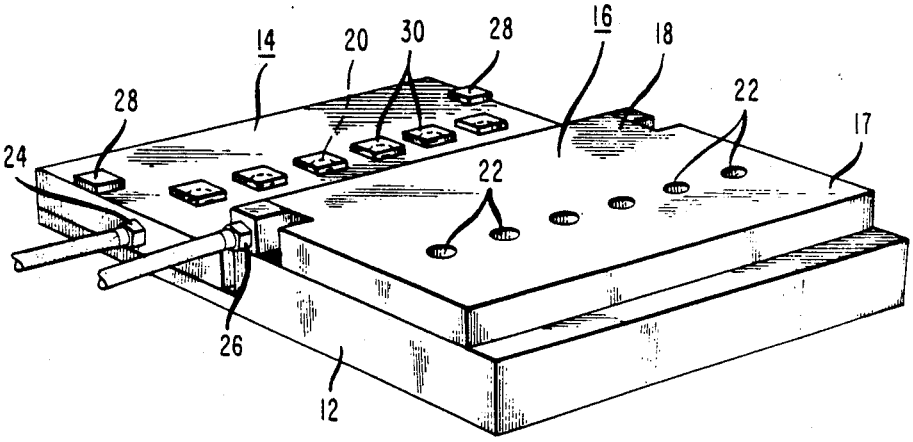
FIG. 5 illustrates the final position of the apparatus of FIG. 1, with the articles transferred to the fixed plate and the hinged plate returned to its starting position.

The state of apparatus 10 at the completion of the inversion process is illustrated in FIG. 4, where the gap between plates 14 and 16 created by spacer 28 can clearly be seen. At this point in time, the vacuum attached to plate 16 is deactivated and that associated with plate 14 is activated. Therefore the chips are released from top surface 17 of plate 16 and adhere to holes 20 formed in top surface 15 of stationary plate 14. When the transfer is completed, hinged plate 16 is returned to its fully opened position and chips 30 remain on plate 14. This final configuration is shown in FIG. 5, where chips 30 are illustrated in phantom as secured to top surface 15 of stationary plate 14.

What is claimed is:

1. Apparatus for inverting articles comprising a pair of hinged plates having substantially flat top major surfaces, each plate including a plurality of holes formed in its associated top major surface such that there exists substantial correlation between each plurality of holes in terms of number, size and position, the articles to be inverted capable of being positioned over the plurality of holes in a first plate of said pair of hinged plates such that a separate article is positioned over each hole;

vacuum connection means attached to each plate of said pair of hinged plates for creating a suction through the plurality of holes associated with either plate of said pair of hinged plates, said suction capable of securing said articles positioned over said first plate to said top major surface thereof; and pivoting means for rotating said pair of plates about the hinge, to bring said top major surfaces into close proximity, said pivoting means and said vacuum connection means operating in conjunction to transfer said articles from said first plate to the second, remaining plate of said pair of hinged plates at the conpletion of the rotation about said hinge whereby said vacuum connection means deactivates the suction associated with said first plate and activates the suction associated with said second plate to transfer the articles and secure the articles in inverted form over the plurality of holes formed in the top major surface of said second plate such that a separate article is positioned over each hole.

2. Apparatus for inverting articles as defined in claim 1 wherein the inverting apparatus further comprises a spacing element disposed on the top surface of a plate of the pair of hinged plates to prevent full contact of said pair of plates when brought into close proximity by the pivoting means.

3. Apparatus for inverting articles as defined in claim 1 or 2 wherein a first plate of the pair of plates remains stationary when the pivoting means rotates said pair of hinged plates together, said first plate being defined as a fixed plate and the second, remaining plate being defined as a hinged plate.

4. Apparatus for inverting articles as defined in claim 3 wherein the articles to be inverted are placed over the plurality of holes in the hinged plate.

5. Apparatus for inverting articles as defined in claim 3 wherein the articles to be inverted are placed over the plurality of holes in the fixed plate.

6. Apparatus for inverting articles as defined in claim 1 or 2 wherein the articles comprise lightwave semiconductor devices.

7. Apparatus for inverting articles as defined in claim 6 wherein lightwave devices comprise semiconductor lasers.

8. Apparatus for inverting articles as defined in claim 6 wherein the lightwave devices comprise semiconductor light emitting diodes.

9. Apparatus for inverting articles as defined in claim 6 wherein the lightwave devices comprise semiconductor avalanche photodiodes.

10. Apparatus for inverting articles as defined in claim 6 wherein the lightwave devices comprise semiconductor p.i.n. photodiodes.

11. A method for inverting articles using a pair of vacuum-controlled hinged plates having substantially flat top major surfaces, each plate including a plurality of holes formed in its associated top major surface such that there exists substantial correspondence between each plurality of holes in terms of number, size and position, the method comprising the steps of:

a. placing the articles to be inverted over the plurality of holes in a first plate of said pair of hinged plates such that a separate article is positioned over each hole;

b. activating a vacuum associated with said first plate to secure said articles to said top major surface thereof;

c. rotating said pair of hinged plates together so as to bring said pair of top major surfaces into close proximity;

d. transferring said articles from said first plate to a second, remaining plate of said pair of hinged plates by deactivating said vacuum associated with said first plate and activating a vacuum associated with said second plate, said articles disposed such that a separate article is positioned over each hole of the plurality of holes formed in the top major surface of said second plate; and e. rotating said pair of hinged plates so as to expose said pair of top major surfaces.

12. The method according to claim 11 wherein in the performing step (c), a spacing element included on either plate is utilized to prevent the pair of top major surfaces from coming into complete contact.

13. The method according to claim 11 or 12 wherein in performing step (c), a first plate of the pair of hinged plates remains stationary and the second, remaining plate rotates into proximity of said first plate.

14. The method according to claim 13 wherein in performing step (a), the articles are placed on the first, stationary plate.

15. The method according to claim 13 wherein in performing step (a), the articles are placed on the second rotating plate.

* * * * *